United States Patent [19]

Van Buskirk et al.

[11] Patent Number: 5,282,170
[45] Date of Patent: Jan. 25, 1994

[54] NEGATIVE POWER SUPPLY

[75] Inventors: Michael A. Van Buskirk, San Jose; Johnny C. Chen, Cupertino; Chung K. Chang, Sunnyvale; Lee E. Cleveland, Santa Clara, all of Calif.; Antonio Montalvo, Raleigh, N.C.

[73] Assignee: Advanced Micro Devices, Inc., Sunnyvale, Calif.

[21] Appl. No.: 964,807

[22] Filed: Oct. 22, 1992

[51] Int. Cl.[5] .............................................. G11C 13/00
[52] U.S. Cl. .................................... 365/226; 365/227; 365/900
[58] Field of Search ........... 365/226, 227, 185, 189.01, 365/218, 900

[56] References Cited

U.S. PATENT DOCUMENTS

5,168,466  12/1992  Kuo et al. ............................ 365/900

Primary Examiner—Terrell W. Fears
Attorney, Agent, or Firm—Davis Chin

[57] ABSTRACT

A negative power supply for generating and supplying a regulated negative potential to control gates of selected memory cells via wordlines in an array of flash EEPROM memory cells during flash erasure includes charge pumping means (12) formed of a plurality of charge pump stages (401-404) for generating a high negative voltage, and cancellation means coupled to each stage of the charge pump means for effectively canceling out threshold voltage drops in the charge pump means. A regulator means (16) responsive to the high negative voltage and a reference potential is provided for generating the regulated negative potential so that it is independent of an external supply potential (VCC).

19 Claims, 8 Drawing Sheets

NEGATIVE POWER SUPPLY

BACKGROUND OF THE INVENTION

1. Field of the Invention

This invention relates generally to floating gate memory devices such as an array of flash electrically erasable programmable read-only memory (EEPROM) cells with page erase and negative voltage gate erase. More particularly, the present invention relates to an improved negative power supply for generating and supplying a regulated negative potential to control gates of selected memory cells via wordlines in an array of flash EEPROM memory cells during flash erasure.

2. Description of the Prior Art

In U.S. Pat. No. 5,077,691 to Sameer S. Haddad et al, issued on Dec. 31, 1991, there is disclosed a flash EEPROM array which has a negative gate voltage erase operation. The '691 patent is assigned to the same assignee as in the present invention and is hereby incorporated by reference. One of the advantages obtained by applying a negative erase voltage through the wordlines to the control gates rather than applying a positive erase voltage through the source common line to the source regions of all memory cells in the flash EEPROM array simultaneously is that erasure can be made to occur selectively on a row-by-row basis rather than by having to erase all the memory cells of a chip simultaneously. Preferably, groups of rows are formed such that each group defining a sector provides a page-selectable erase block. For example, the memory array consisting of a large number, $N \times M$ (i.e., 1,000 or more) of such memory cells are typically formed on a single integrated circuit chip in an $N \times M$ matrix form, where N equals the number of columns and M equals the number of rows. If the matrix is assumed to have 1 million cells (i.e , $1024 \times 1024$), then groups of 128 rows each could be formed together so as to divide the matrix into eight sectors. Hence, the memory array could be erased selectively sector-by-sector or any given number of sectors rather than all memory cells being erased simultaneously.

During a sector-erase mode of operation, a relatively high negative potential (i.e., $-12$ V) is applied to the control gates via the wordlines of the selected sector(s) while VCC volts is applied to the control gates of memory cells in the non-selected sectors. Further, the source regions of all transistors in the selected sector are raised to a positive level of approximately $+0.5$ V to $+5.0$ V, and the drain regions thereof are allowed to float. In FIG. 4 of the '691 patent, there is shown a schematic circuit diagram of a single stage used for forming a negative charge circuit of FIG. 4C containing five such stages in order to generate the high level negative potential of approximately $-13$ V to $-15$ V. The negative charge pump circuit of FIG. 4C is used for the charge pump block 204 shown in FIG. 2B of the '691 patent. Each charge pump stage is formed of a pair of capacitors and a pair of P-channel transistor devices. Since the P-channel transistor devices have such a large body effect coefficient and the back-bias is so high, the threshold voltage $V_\phi$'s can be as high as $-2.5$ volts. As a result, the five-stage charge pump circuit of FIG. 4C is thus made impractical.

In U.S. Pat. No. 5,126,808 to Antonio J. Montalvo et al. issued on Jun. 30, 1992, there is taught a flash EEPROM array with paged erase architecture. The '808 patent is also assigned to the same assignee as in the present invention and is hereby incorporated by reference. In FIG. 7A of the '808 patent, there is shown a schematic circuit diagram of a single stage of a charge pump circuit, similar to FIG. 4 of the '691 patent, for generating the negative gate erase voltage. FIG. 7B depicts five such charge pump stages connected together to form the charge pump circuit for generating the $-13$ V. Again, the construction of each charge pump stage is done with a pair of capacitors and a pair of P-channel transistors.

The present invention represents a significant improvement over the charge pump circuits shown in the respective '691 and '808 patents discussed above. The negative power supply of the present invention is used for generating and supplying a regulated negative potential to control gates of selected memory cells via wordlines in an array of flash EEPROM memory cells during flash erasure. The negative power supply includes a negative charge pump circuit formed of a plurality of charge pump stages for generating a high negative voltage and a cancellation circuit coupled to the charge pump circuit for effectively canceling out threshold voltage drops in the charge pump circuit. The negative power supply further includes a regulation circuit which is responsive to the high negative voltage and a reference potential for generating the regulated negative potential to be independent of a power supply potential VCC.

SUMMARY OF THE INVENTION

Accordingly, it is a general object of the present invention to provide an improved negative power supply for generating and supplying a regulated negative potential to control gates of selected memory cells via wordlines in an array of flash EEPROM memory cells during flash erasure, but yet overcomes the disadvantages of the prior art power supplies.

It is an object of the present invention to provide an improved negative power supply for generating and supplying a regulated negative potential which includes a negative charge pump circuit for generating a high negative voltage and a cancellation circuit for effectively canceling out threshold voltage drops in the charge pump circuit.

It is another object of the present invention to provide an improved negative power supply for generating and supplying a regulated negative potential which includes a negative regulator circuit for controlling the regulated negative potential to be independent of an external power supply potential VCC.

It is still another object of the present invention to provide an improved negative power supply for generating and supplying a regulated negative potential which includes a charge pump circuit formed of a plurality of charge pumping stages, each stage having a pass transistor, an initialization transistor, a precharge transistor, a first coupling capacitor, and a second coupling capacitor, said pass transistor coupling an input node to an output node without the threshold voltage drop of $V_\phi$.

In accordance with these aims and objectives, the present invention is concerned with the provision of a negative power supply for generating and supplying a regulated negative potential to control gates of selected memory cells via wordlines in an array of flash EEPROM memory cells during flash erasure. The negative power supply includes a clock circuit for generating a plurality of clock signals and a charge pumping circuit responsive to an external power supply potential VCC and to the clock signals for generating a high negative voltage. A cancellation circuit is coupled to the charge pumping circuit for effectively canceling out threshold voltage drops in the charge pumping circuit.

The charge pumping circuit is formed of a plurality of charge pump stages. A negative well circuit is coupled to the plurality of charge pumping stages for preventing initially the operation of a certain number of the plurality of charge pumping stages during erasure. A regulator circuit is responsive to the high negative voltage and a reference potential for generating a negative comparator signal which is either at a high level so as to allow the charge pumping circuit to increase the high negative voltage or at a low level so as to decrease the high negative voltage and for generating the regulated negative potential that is independent of the power supply potential VCC.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
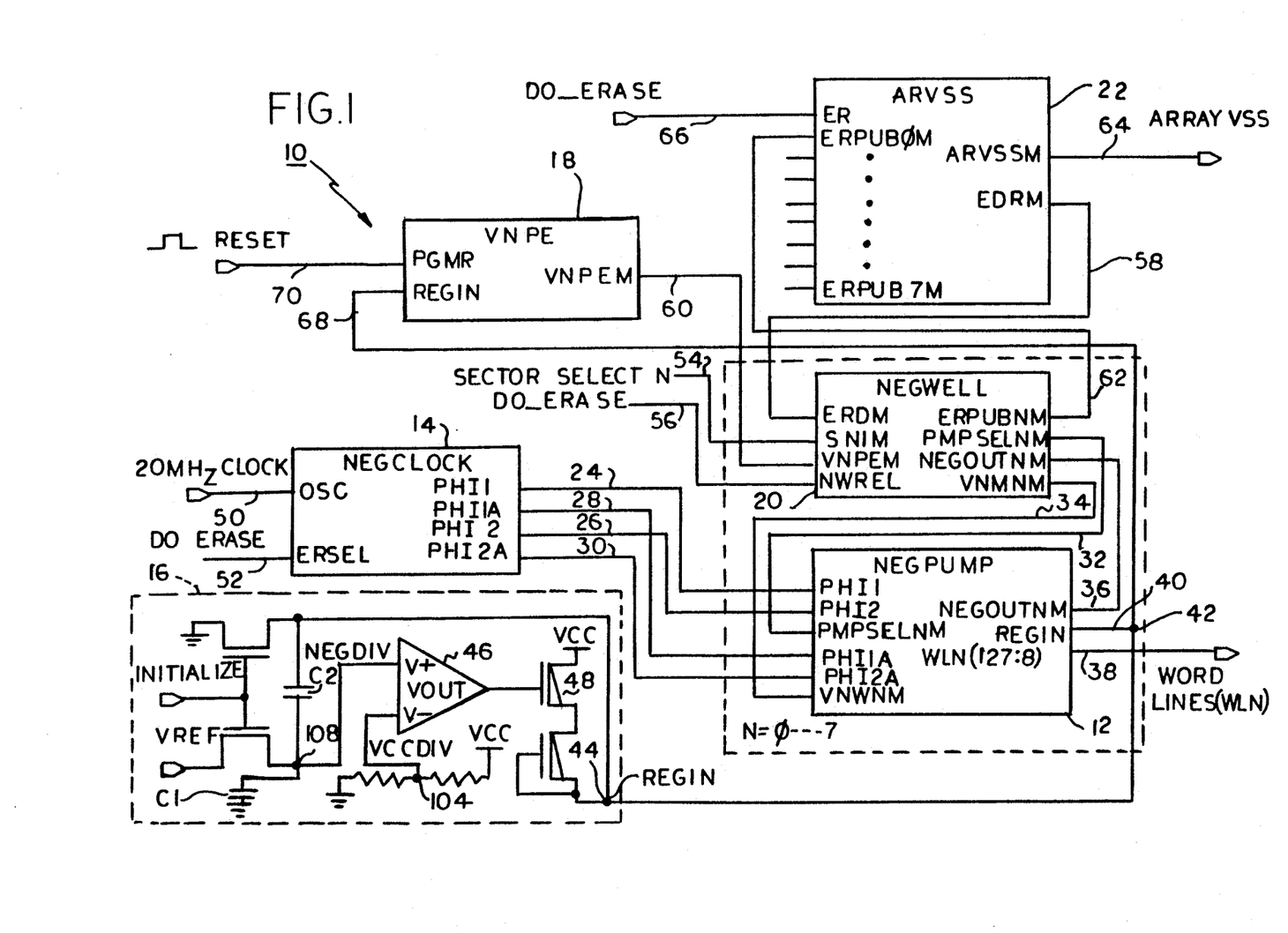
FIG. 1 is a block diagram of a negative power supply, constructed in accordance with the principles of the present invention.

Referring now in detail to the drawings, there is shown in block diagram form in FIG. 1 a negative power supply 10 for generating and supplying a regulated negative potential to control gates of selected memory cell transistors through the wordlines during the flash erase mode of operation, which is constructed in accordance with the principles of the present invention. The negative power supply 10 is formed as a part of a single integrated circuit chip (not shown) which contains an array having a large number of flash EEPROM memory cells arranged in an N×M matrix. An external or offchip power supply potential VCC (also not shown) which is typically at +5.0 V, is supplied to the integrated circuit chip and is fed to the input of the negative power supply 10. The array of the flash EEPROM memory cells is formed on a substrate to define columns and rows, where the substrate includes a common source line extending along at least one of the rows and a plurality of bit lines extending along respective columns. Each of the memory cells includes an N-type source region coupled to the common source line, a control gate, a floating gate, a channel region and an N-type drain region coupled to a respective one of the bit lines. Further, each of the memory cells is programmable predominately by transferring hot electrons into its floating gate and is erasable predominately by tunneling electrons from its floating gate to its source region.

The negative power supply 10 generates a relatively high negative voltage NEGOUT through the use of a P-channel charge pump circuit 12 that is responsive to a four-stage negative clock circuit 14 for creating a large voltage swing on gates of pass transistors in the charge pump circuit so as to effectively cancel out the threshold voltage drops $V_\phi$. The power supply 10 includes a negative regulator circuit 16 which is implemented to adjust the high negative gate voltage with respect to the external power supply voltage VCC (+5.0 volts) so that the erase field is independent of the power supply voltage VCC. The power supply also includes a protection circuit 18 which provides proper protection of the oxide of the P-channel pull-up device in a negative well circuit 20 which is used to generate the negative well voltage VNW. Further, the negative power supply includes an array VSS circuit 22 which is used to supply +5.0 volts to the source regions of the selected memory cells during erasure.

Figure 2:
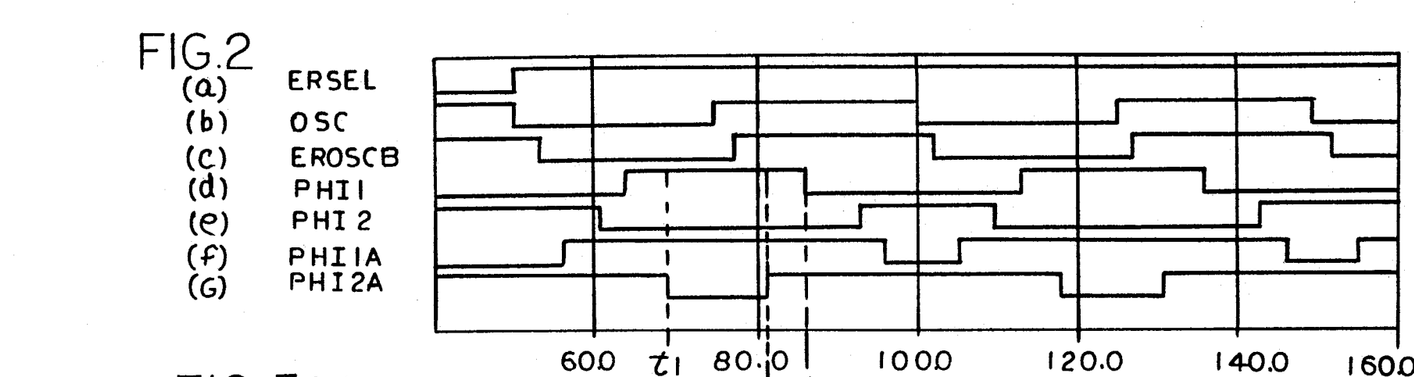
FIG. 2(a)-2(g) are timing diagrams of various control signals and clock signals.

The operation of the negative power supply 10 of FIG. 1 will be generally described with reference to the timing diagrams of FIG. 2 and 3(a). Specific circuitry suitable for use in the blocks 12, 14, 16, 18, 20 and 22 of FIG. 1 so as to implement the functions described will be presented with reference to the schematic circuit diagrams of FIGS. 4 through 11.

With reference again to FIG. 1, the negative pump circuit 12 receives four input clock signals PHI1, PHI2, PHIA, and PHI2A on respective lines 24, 26, 28 and 30. The input clock signals whose waveforms are illustrated in FIGS. 2(d)-2(g) are generated from the negative clock circuit 14. The charge pump circuit 12 is selected by an input select signal PMPSELnm on line 32, which is generated by the negative well circuit 20. It should be understood that where the memory array is physically arranged in the matrix of 1024 rows by 1024 columns, the rows may be divided into 8 sectors with each sector being composed of 128 rows. Thus, the pump circuit 12 represents only one of the sixteen charge pump circuits, one pump circuit being formed on each side (left and right) of each of the eight sectors. As used herein, the reference label n is 0, 1, ... 7 and the reference label m is either the left or right sector. The pump circuit also receives an N-well voltage VNMnm on line 34 which is generated by the negative well circuit 20. Likewise, there are sixteen such negative well circuits 20 formed on the integrated circuit chip, each left and right sides of each sector.

The pump circuit 12 is used to generate the high negative voltage NEGOUT on line 36 which is approximately −12 volts. This negative voltage is passed to the 128 wordlines WLN on line 38 via a plurality of diode-connected transistors, one diode-connected transistor for each wordline. The negative voltage is also passed to the output node REGIN on line 40 via two diodes.

The erase field (the voltage on the floating gate) is regulated by the negative regulator circuit 16, which controls the node 42 so that it is independent of external power supply potential VCC. Prior to the erase mode, the signal INITIALIZE is made high so as to allow the reference voltage VREF of approximately +2.0 volts to charge up the capacitors C1 and C2 with the output signal at the node REGIN being grounded. During the erase mode, the signal INITIALIZE is made low so as to isolate the reference voltage VREF. A negative comparator 46 is used to compare the voltage NEGDIV at node 108 with the voltage VCCDIV at the node 104. When the voltage NEGDIV is larger than the voltage VCCDIV, the output voltage VOUT of the comparator is high which turns off the pull-up transistor 48 so as to isolate the supply potential VCC from the node 44. On the other hand, when the voltage NEGDIV is smaller than the voltage VCCDIV, the output voltage VOUT will be low which turns on the pull-up transistor 48, pulling the node 44 towards the power supply potential VCC.

The negative clock circuit 14 receives a 20 MHz clock signal on line 50 and a erase control signal DO ERASE on line 52 which is connected to node ERSEL. The waveforms of the clock signals PHI1, PHI2, PHIA, and PH2A are generated at the outputs of the negative clock circuit 14, which is shown in the collection of schematic circuit diagrams in FIGS. 12(a)-12(e).

The negative clock well circuit 20 receives as its inputs sector control signal SECTOR SELECT N on node SN1m via line 54, the erase control signal DO ERASE on line 56, an input delayed erase signal on node ERDm at line 58, and a protection signal VNPEm on line 60. It will be noted that the signal at the node ERDm is a delayed version of the erase control signal DO ERASE which is connected to node ER of the array VSS circuit 22. The erase control signal DO ERASE is applied via the line 56 to the node NWREL. During the erase mode, the signal on the node ERDm will be high and the sector control signal on the node SN1m is used to select the pump circuit 12 by causing the pump select signal PMPSELnm on the line 32 to go high. As a result, an N-channel transistor in the pump circuit is turned on so as to provide a current path to a lower supply potential VSS (gnd). Also, the output signal on node ERPUBnm (on line 62) will go low which is fed to the node ERPUBϕ. As a result, the array VSS signal on line 64 is caused to be pulled to +5.0 volts during erasure.

The array VSS circuit 22 also receives the erase control signal DO ERASE on line 66, which is connected to the node ER. The array VSS circuit 22 further includes input node ERPUBϕm through ERPUB7m which are connected to other corresponding output signals on negative well circuits similar to the output signal on the node ERPUBmn (line 62). The array circuit 22 includes the erase delay circuit of FIG. 10 and generates the input delayed erase signal on node ERDm. The array circuit 22 also generates the array VSS signal on the line 64.

The protection circuit 18 receives on its first input node REGIN the output signal at the node 44 via the node 42 and line 68. In response to the output signal at the node REGIN, the protection signal VNPEm on the line 60 is pulled to be below the ground potential during erasure so as to reduce the field across the gate oxide of the pull-up transistor in the negative well circuit 20. The protection circuit 18 includes a second input node PGMR connected to line 70 for receiving a reset signal RESET so as to discharge the voltage of the protection signal VNPEm during the non-erase mode.

Figure 3A:
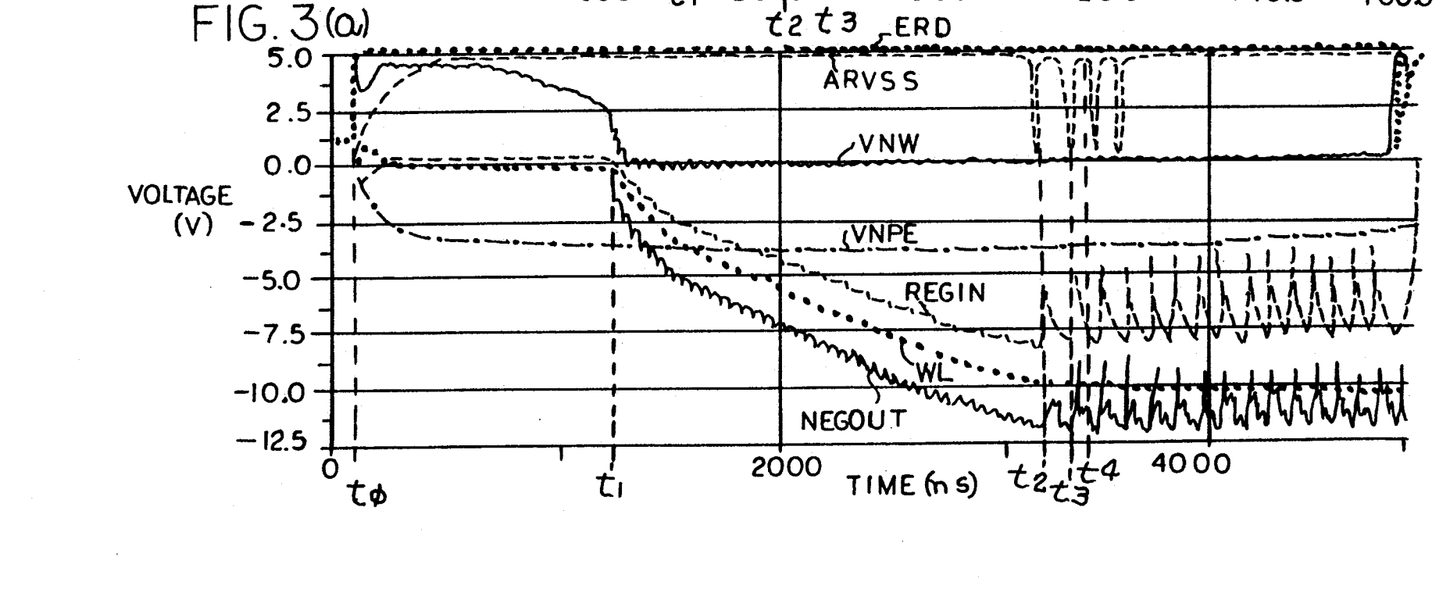
FIG. 3(a) is a timing diagram indicating the state of various signals in FIG. 1, useful in understanding the operation of the present invention.

Referring now to FIG. 3(a), at time tϕ the erase control signal DO ERASE (ERD) is made high (+5.0 volts). As a result, the array VSS signal at the output node ARVSSm (line 66) begins to increase from 0 volts to +5.0 volts. The high negative voltage NEGOUT will begin to decrease from the level of +5.0 volts. Also, the N-well voltage VNW will begin decreasing from +5.0 volts. It will be noted that the negative voltage NEGOUT is held at the power supply potential VCC (+5.0 volts) for about 1 uS before being allowed to decrease to 0 volts at time t1, thereby preventing the latter stages of the pump circuit in FIG. 4(a) from pumping.

At the time t1, the protection voltage VNPE is pulled negative to about −3.0 volts so as to protect the oxide of the pull-up transistor in the negative well circuit 20. Between the times t1 and t2, the pump circuit 12 is working and pumping the voltage NEGOUT to approximately −12 volts. The output signal on the node REGIN will follow the voltage NEGOUT and will be at approximately −8 volts at the time t2. Also, the signal on the wordline WL defining a regulated negative potential will follow the negative voltage NEGOUT and will be at approximately −10 volts at the time t2.

At the time t2, the regulator circuit 16 will begin its operation so as to control the voltage on the wordline WL to be maintained at approximately −10 volts. If the negative voltage NEGOUT goes below −12 volts, the negative comparator signal NEGCOMP will go low, such as at the time t3, so as to pull up or decrease the negative voltage NEGOUT and the output signal at the node REGIN. Then, the negative comparator signal NEGCOMP will go high, such as at the time t4, so as to allow the negative voltage NEGOUT to increase or go lower again. This cycle is repeated over and over again so as to provide the regulated negative potential on the wordline WL.

Figure 4A:
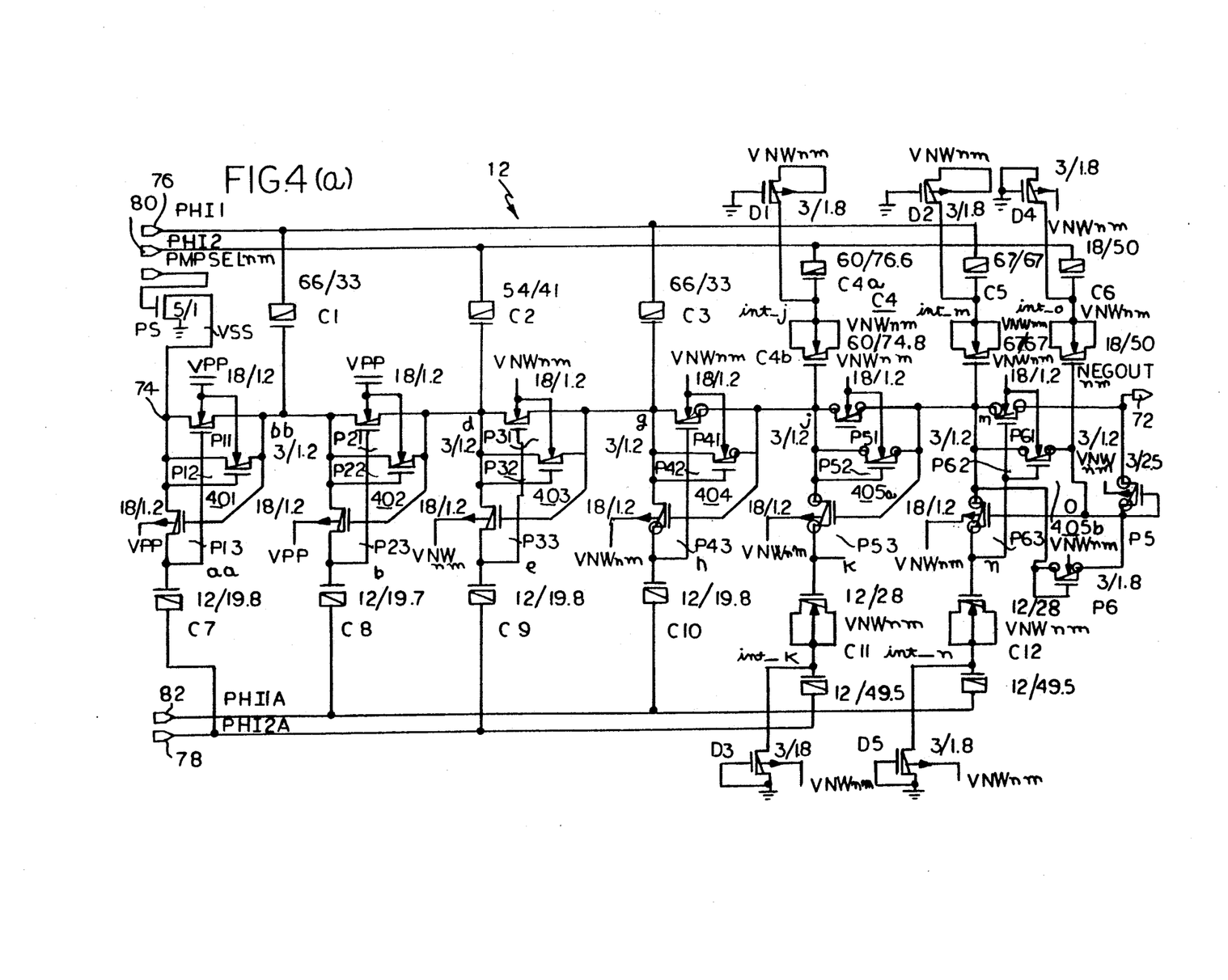
FIG. 4(a) is a detailed schematic circuit diagram of the negative pump circuit of FIG. 1.
Figures 4B, 4C, 5, 6:
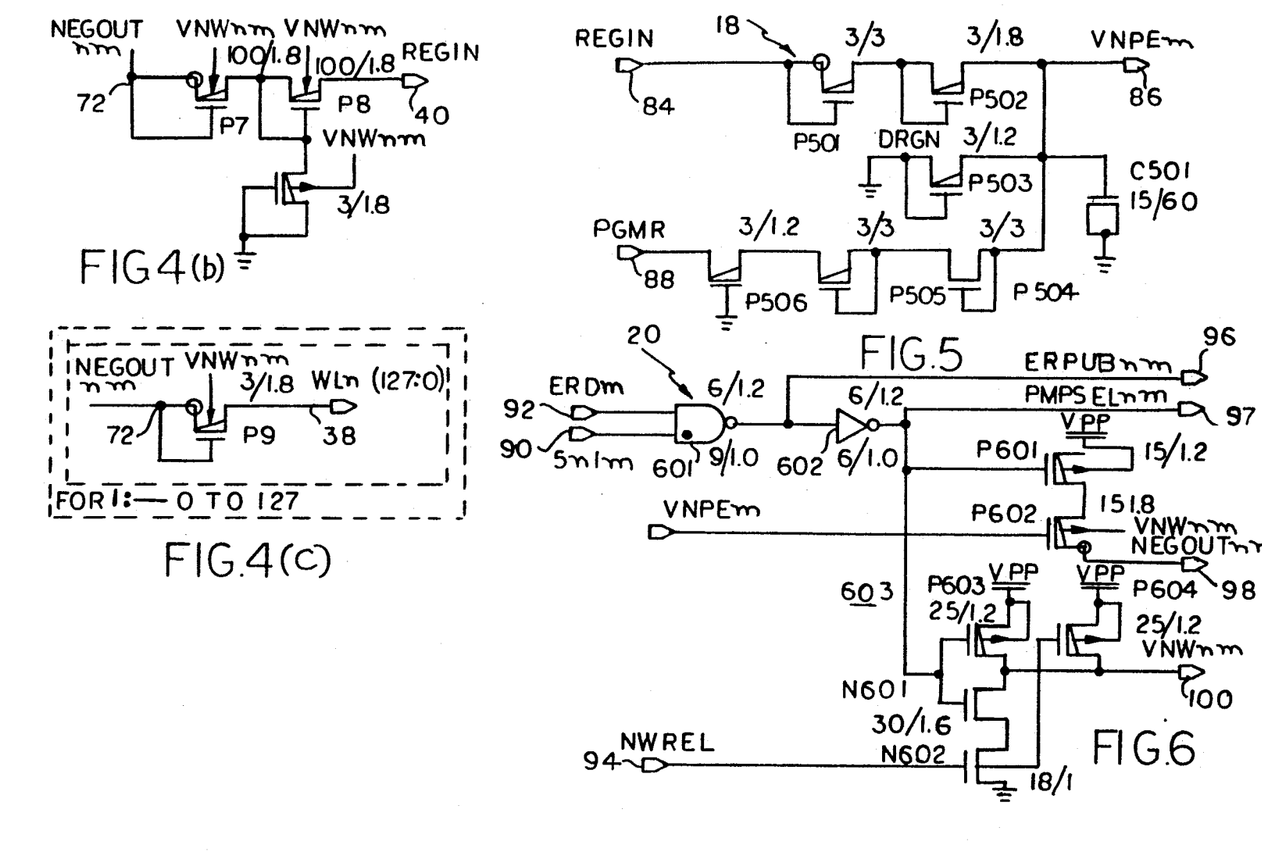
FIG. 4(b) is a circuit diagram for generating the signal REGIN.
FIG. 4(c) is a circuit diagram, illustrating the signal NEGOUT coupled to the wordlines.
FIG. 5 is a schematic circuit diagram of the protection circuit of FIG. 1 for generating the signal VNPE.
FIG. 6 is a circuit diagram of the negative well circuit of FIG. 1 for generating the signal VNW.

A detailed schematic circuit diagram of the negative pump circuit 12 of FIG. 1 is depicted in FIGS. 4(a)-4(c). Referring now to FIG. 4(a), the negative pump circuit 12 includes four stages 401, 402, 403, and 404 and an output buffer stage 405 for generating the high negative voltage NEGOUT on output node 72, which is approximately −12 volts. The input of the pump circuit is at input node 74. An N-channel pump select transistor PS has its drain connected to the input node 74, its gate connected to receive the input select signal PMPSELnm, and its source connected to the lower power supply potential VSS (gnd). The pump circuit 12 is selected when the signal PMPSELnm is high so as to turn on the select transistor PS, thereby creating a current path to the lower power supply potential VSS. In the non-erase modes, the select transistor PS is turned off so as to prevent any dc current path from the upper power supply potential VPP. The negative voltage NEGOUT at the output node 72 is also pulled to the upper power supply potential VPP during the non-erase mode. Further, the outputs of the negative well and negative pump circuits, which are deselected during the erase mode, are pulled to the upper power supply potential VPP.

The first stage 401 is formed of a P-channel pass transistor P11, a P-channel initialization transistor P12, a P-channel pre-charge transistor P13, and a pair of coupling capacitors C1, C7. The pass transistor P11 has its source connected to the input node 74, its drain connected to an output node bb, and its gate connected to an internal node aa. The initialization transistor P12 is a diode-connected transistor in which its drain and gate are connected together and to the source of the transistor P11. The source of the transistor P12 is connected to the drain of the transistor P11 and to the gate of the transistor P13. The transistor P13 has its drain connected to the internal node aa and to the gate of the transistor P11. The transistor P13 has its source connected to the source of the transistor P11 and to the drain of transistor P12. The N-well of the transistors P11-P13 are connected to the upper power supply potential VPP. The coupling capacitor C1 is coupled between the output node bb and an input node 76 for receiving the clock signal PHI1. The coupling capacitor C7 is coupled between the internal node aa and an input node 78 for receiving the clock signal PHI2A. Each of the coupling capacitors C1 and C7 are formed of MOS transistors.

The second stage 402 is identical in its construction to the first stage 401 and includes P-channel transistors P21, P22 and P23 and coupling capacitors C2, C8. The input of the second stage 402 is at the input node bb, and the output thereof is at node d. The coupling capacitor C2 is coupled between the output node d and an input node 80 for receiving the clock signal PHI2. The coupling capacitor C8 is coupled between the internal node b and an input node 82 for receiving the clock signal PHI1A. The third stage 403 is likewise identical in its construction to the first stage 401 and includes P-channel transistors P31, P32, P33 and coupling capacitors C3, C9. The input of the third stage 403 is at the node d, and the output thereof is at the node g. The coupling capacitor C3 is connected between the output node g and the input node 76 for receiving the clock signal PHI1. The coupling capacitor C9 is coupled between the internal node e and the input node 78 for receiving the clock signal PHI2A. However, it should be noted that the N-well of the transistors P31, P32 and P33 are tied to the negative well voltage VNWnm rather than, to the supply potential VPP so as to prevent junction breakdown.

The fourth stage 404 is similar in its construction to the first stage 401 and includes P-channel transistors P41, P42, P43 and coupling capacitors C4, C10. The input of the fourth stage is at the node g and the output thereof is at output node j. The coupling capacitor C4 is coupled between the node j and the input node 80 for receiving the clock signal PHI2. The coupling capacitor C10 is connected between the internal node h and the input node 82 for receiving the clock signal PHI1A. It will be noted that the capacitor C4 is formed by stack capacitors C4a and C4b since the field at the node j is quite high. The internal node intj is initially tied to the supply potential VCC via the diode-connected transistor D1. The prevents the fourth stage from pumping, but the first, second and third stages are not prevented from pumping and thus pump node g negative. When the negative well voltage VNWnm is pulled to ground during erase, the internal node is released so as to allow the fourth stage 404 to pump. The internal node will be initialized at 1 volts by the transistor D1 so as to turn on the capacitor C4. The source/drain junctions of the transistors P41, P42 and P43 are "donuted" so as to increase the junction breakdown voltage. The term "donut" refers to encircling the source/drain junction with polysilicon.

The output buffer stage 405 includes a first buffer stage 405a, a second buffer stage 405b, a first discharge transistor P5 and a second discharge transistor P6. The first and second buffer stages 405a and 405b are similar in their construction to the fourth pump stage 404. The buffer stage 405a is formed of P-channel transistors P51, P52 and P53 and stacked capacitors C5, C11. The input of the stage 405a is at the node j and the output thereof is at node m. The internal nodes intm and intk are initialized by the diode-connected transistors D2, D3. Similarly, the buffer stage 405b is formed of P-channel transistors P61, P62 and P63 and stacked capacitors C6, C12. The input of stage 405b is at a node m and the output thereof is at the output node 72. The internal nodes into and intn are initialized by the diode-connected transistors D4, D5.

The transistors P5 and P6 are diode-connected transistors which provide a discharge path. After the erase mode, the negative voltage must be discharged from the pump circuit 12. If the transistors P5 and P6 were omitted, when the output node 72 of the output buffer stage 405 is pulled high, the pre-charge transistor P63 would be turned off and the negative voltage at the internal node n would be trapped on the pre-charge capacitor C12. In order to eliminate this problem, the transistors P5 and P6 have been added to the output buffer stage 405. It will be noted that the source of the transistor P62 is not connected to the output node 72. During pumping, the difference between the voltages at the nodes o and 72 is about 4 volts. The transistor P63 is turned on, but is quite weak so as to have little effect on the pump. After erase, the output node 72 is pulled to the supply potential VPP by the negative well circuit 20. This increases the gate-to-source voltage $V_\phi$ of the transistor P63 and discharges the node o slowly. Since the discharge is slow, the transistor P63 will be turned on and the node n will follow the node m. However, this in turn leaves the internal node k trapped with a negative voltage. This problem is solved by continuing the clocks to run during a portion of PGMR and assuring that the clock signal PHI2A finishes high. As a result, the erase field is limited to under $-13$ volts. It will be noted that the diode-connected initialization transistors P12-P62 not only assist in initializing the pump, but also facilitate in discharging the pump.

The operation of the negative pump circuit 12 depicted in FIG. 4(a) will now be described with reference to the waveforms in FIGS. 2(d)-2(g) and 3(b). Referring to the first charge pump stage 401, the pump circuit 12 is started by the pump select signal PMPSELnm going high so as to pull the input node 74 to ground via the select transistor PS. It is assumed that prior to the start of the operational cycle (i.e., before time t1 in FIG. 2) the clock signal PHI1 and PHI2A are both at the high level (+5.0 volts). Thus, when the node 74 is pulled low (0 volts) the initialization transistor P12 will cause the node bb to be one threshold drop above the node 74 or at 1 volt. Further, the pre-charge transistor P13 will cause node aa to be another threshold drop above the node bb or at +2 volts. Thus, at the time prior to t1, both the transistors P2 and P3 are turned on slightly, but the transistor P1 will be turned off.

Consequently, when the clock signal PHI2A in FIG. 2(g) drives the capacitor C7 from +5 volts to 0 volts at, time t1, the node aa will also be dropped by the same 5 volts and will be at −3 volts. This causes a large voltage swing on the gate of the pass transistor P11 which is turned on hard so that the 0 volts at the input node 74 is passed to the output node bb without a loss of a threshold drop $V_\phi$ from the transistor P11. As a result, the node bb will be pulled to 0 volts, thereby turning off the transistors P2 and P3.

The transistors 11–P41 and the capacitors C1–C4 are connected as a conventional voltage multiplier of the diode chain type in which the clock signals are coupled to the inputs via capacitors connected in parallel. Therefore, there will be a threshold voltage $V_\phi$ lost across each transistor. For a more complete discussion of the conventional voltage multiplier, reference is made to the article by John F. Dickson, "On-Chip High-Voltage Generation in MNOS Integrated Circuits Using An Improved Voltage Multiplier Technique," IEEE *Journal of Solid-State Circuits*, Vol. SC-11, No. 3, June 1976, pp. 374–378. Unlike the prior art voltage multipliers, the negative pump circuit of the present invention includes in its first stage an initialization transistor (P12), a pre-charge transistor (P13), and the capacitor C7 functioning as a cancellation means for effectively canceling out the threshold voltage drops $V_\phi$. If it were not for transistors P12, P13 and C7, the voltage at the node bb would be different from the voltage on the node 74 by the threshold voltage drop $V_\phi$ from the pass transistor P11. A similar threshold voltage drop would be experienced across the pass transistor P21–P41 in the other pump stages.

When the clock signal PHI2A in FIG. 2(g) goes back to +5 volts at the time t2, the node aa will be returned to +2 volts so as to turn off the transistor P11. Simultaneously, a pre-charge transistor P13 will be turned on passing the voltage at the node 74 to the node aa without a threshold voltage drop. Next, when the clock signal PHI1 in FIG. 2(d) drives the capacitor C5 from +5 volts to 0 volts at time t3 the node bb will be lowered to −5 volts. In this manner, the output node bb of the first stage has been pumped to −5 volts.

Figure 3B:
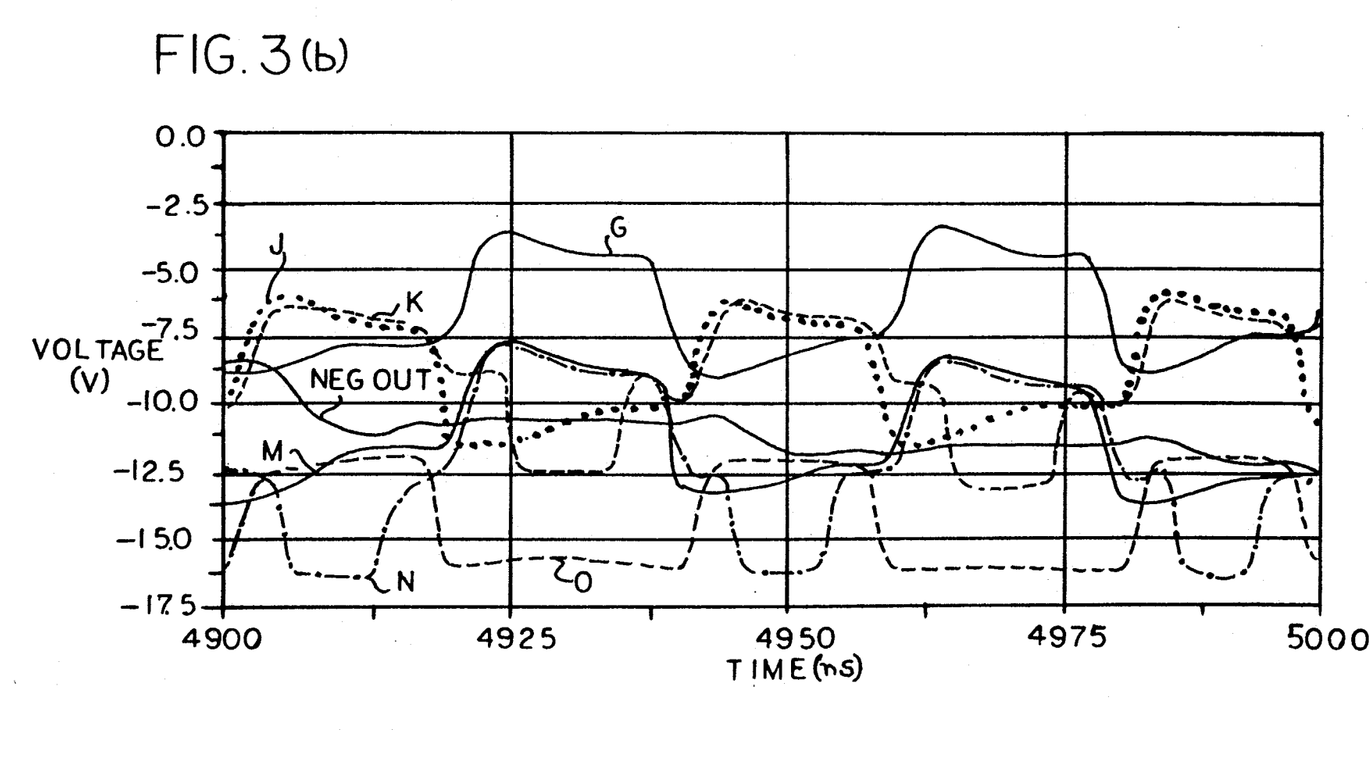
FIG. 3(b) is a timing diagram indicating the state of various signals at certain internal nodes in FIG. 4(a), useful in understanding the operation of the negative pump circuit.

Subsequently, the second charge pump stage 402 will cause its output node d to be pumped to a higher negative potential (i.e., −7.3 volts) via the clock signals PHIA and PHI2 in FIGS. 2(f) and 2(e), respectively. The third pump stage 403 will cause its output node g to be pumped to a higher negative voltage of approximately −8.5 volts by the clock signals PHI1 and PHI2A. The fourth stage 404 will cause its output node j to be pumped to −11 volts by the clock signals PHI1A and PHI2. The waveforms of various internal nodes of the pump circuit in FIG. 4(a) as well as the voltage NEGOUT at the output node 72 are shown in FIG. 3(b).

In FIG. 4(b), it can be seen that the negative voltage NEGOUT on the output node 72 is coupled to the node REGIN(40) via the two diode-connected P-channel transistors P7 and P8. In FIG. 4(c), the negative voltage NEGOUT is also coupled to the wordline WLn via a plurality of diode-connected P-channel transistors P9, one for each of the 128 wordlines per sector.

FIG. 5 is a circuit diagram depicting circuitry for the protection circuit 18 of FIG. 1. The protection circuit includes a first pair of level-shifting diode-connected P-channel transistors P501, 502; a clamping diode-connected P-channel transistor P503; a filter capacitor C501; a second pair of level-shifting diode-connecting P-channel transistors P504, P505; and a discharge transistor P506. The protection circuit receives the regulated negative voltage on the node REGIN (input node 84) which is passed through the transistors P501 and P502 to the output node 86 for generating the protection signal VNPEm. During erasure, the regulated negative voltage on the node REGIN will be approximately −9 volts, and the voltage VNPEm will be approximately −5 volts which is used to protect the oxide of the pull-up device in the negative well circuit 20. After erase, the reset signal RESET applied to node 88 (PGMR) is made high so as to turn on the transistor P506, causing the voltage on the node 86 to be discharged. The transistor P503 serves to clamp the node 86 to a small positive voltage. The capacitor C503 is used to eliminate any capacitively injected noise so as to avoid disturbances.

The negative well circuit 20 of FIG. 1 is illustrated by the circuit diagram of FIG. 6. The negative well circuit 20 includes a first NAND logic gate 601, an inverter gate 602, a pull-up transistor P601, a protection transistor P602 and a second NAND logic gate 603. The second NAND gate 603 is formed of P-channel transistors P603, P604 and N-channel transistors N601, N602. The first NAND gate 601 has a first input on node 90 (Sn1m) for receiving the erase select control signal SECTOR SELECT N, which is made high in the selected sector during erase. The first NAND gate 601 has a second input on node 92 for receiving the signal ERDm, which is a delayed version of the erase signal ER. The signal DO ERASE is supplied to input node 94 (NWREL) which is also a delayed version of the signal ER. The signal at node NWREL is held low for about 1 uS to aid in the initialization of the pump circuit 12. After that, the signal at the node NWREL will follow the erase signal ER.

Since both the signals applied to Sn1m and ERDm will be high during erase, the output of the gate 601 will be low, which is the signal ERPUBnm on output node 96. This signal ERPUBnm is used to decode the load resistor in the array circuit 22 during the erase mode. The output of the inverter 602 will be high, which is the signal PMPSELnm on node 97 that turns on the N-channel pump select transistor PS in the negative pump circuit 12 (FIG. 4(a)). During the non-erase mode, the signal PMPSELnm will be low which turns on the pull-up transistor P601, thereby pulling up the output node 98 connected to the negative voltage NEGOUT of the pump circuit to the supply potential VPP. It should be noted that the supply potential VPP will be the same as the supply potential VCC (i.e., +5 volts). However, during erase the negative voltage NEGOUT may be higher than −13 volts. If it were not for the protection transistor P602, this negative voltage would be applied directly to the drain of the pull-up transistor P601 which would cause an overstress of 13 volts across the oxide. Due to the voltage VNPEm being approximately −5 volts applied to the gate of the transistor P602, the field across the oxide is only approximately 8 volts.

During erase, it will also be noted that the signal ERDm applied to the node 94 (NWREL) will also be high so as to pull the output node 100, which is the N-well voltage VNWnm, to the lower power supply potential VSS (0 volts). After erase, the negative voltage NEGOUT (node 98) is pulled up by a path which is gated by the delayed erase control signal ERDm which insures that the N-well voltage VNWnm at the node 100 will be at a positive voltage (i.e., VPP) before the negative voltage NEGOUT at the node 98 is pulled positive.

Figure 7:
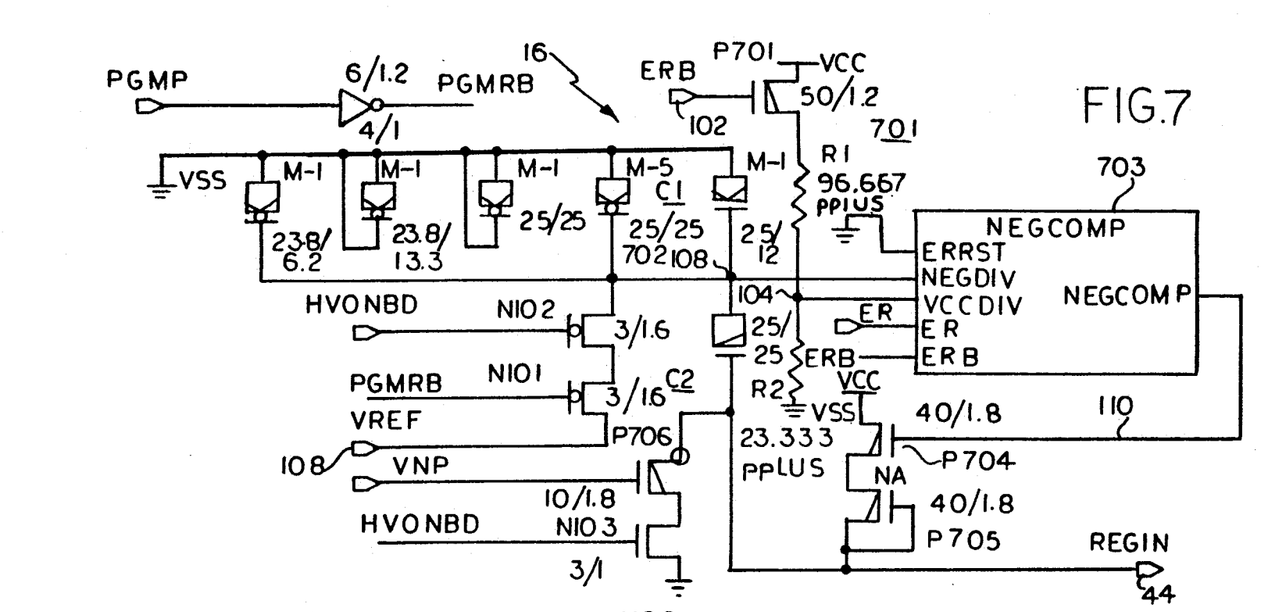
FIG. 7 is a circuit diagram of the negative regulator circuit of FIG. 1.

The negative regulator circuit 16 of FIG. 1 is illustrated in the circuit diagram of FIG. 7. The negative regulator circuit is used to regulate the erase field by controlling the node 42 (REGIN) so that it is independent of the external power supply potential VCC. The negative regulator circuit consists of a reference circuit 701, a pre-charge circuit 702, a differential comparator 703, a pre-charge pull-up transistor P704, and a diode-connected transistor P705. The reference circuit 701 includes a P-channel transistor 701 and a voltage divider formed of resistors R1, R2. The transistor P70 has its source connected to the power supply potential VCC, its gate connected to receive the signal ERB on node 102, and its drain connected to one end of the resistor R1. The other end of the resistor R1 is connected to one end of the resistor R2 at node 104. The other end of the resistor R2 is connected to the power supply potential VSS. A voltage VCCDIV will be developed on the node 104 during erase since the signal ERB will be low.

The pre-charge circuit 702 includes N-channel control transistors N101, N102; an N-well type capacitor C1; a MOS capacitor C2; and discharge transistors P706, N103. The voltage VREF applied to the input node 108 is approximately +2 volts. The voltage VREF is used to precharge the capacitors C1 and C2 when the node 44 (REGIN) is grounded during the non-erase mode. As can be seen, the capacitor C1 is connected between the node 108 and the power supply potential VSS, and the capacitor C2 is connected between the node 108 and the node 44. During erase, the transistors N101 and N102 will be turned off and a voltage NEGDIV will be developed on the node 108. After erase, the transistors P706 and N103 are used to discharge the node 44.

In operation, the differential comparator 703 compares the voltage NEGDIV on the node 108 to the voltage VCCDIV on the node 104 and generates a negative comparator output signal NEGCOMP on line 110. If the voltage NEGDIV is greater than the voltage VCCDIV, the output signal NEGCOMP will be high so as to turn off the P-channel pull-up transistor P704. On the other hand, if the voltage NEGDIV is smaller than the voltage VCCDIV then the output signal NEGCOMP will be low so as to turn on the transistor P704, thereby connecting the node 44 to the power supply potential VCC. As a result, the negative voltage NEGOUT of the charge pump circuit will be pulled up.

Figure 8:
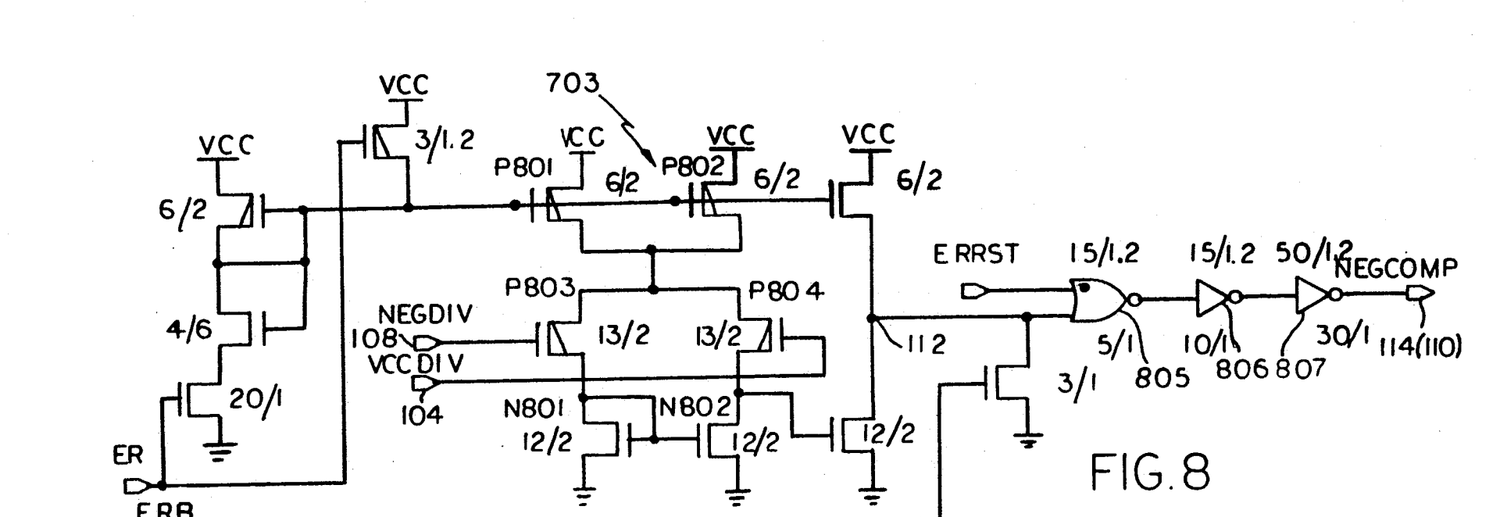
FIG. 8 is a detailed schematic circuit diagram of the negative comparator circuit of FIG. 7.

In FIG. 8, there is shown a detailed schematic circuit diagram of the differential comparator 703 of FIG. 7. The differential comparator includes current source transistors P801, P802; input transistors P803, P804; and load transistors N801 and N802. The gate of the input transistor P803 is connected to the node 108, and the gate of the input transistor P804 is connected to the node 104. The output node 112 of the comparator 703 is coupled via a NOR gate 805 and a pair of series connected inverters 806, 807 to the node 114. The output of the inverter 807 is the signal NEGCOMP.

Figure 9:
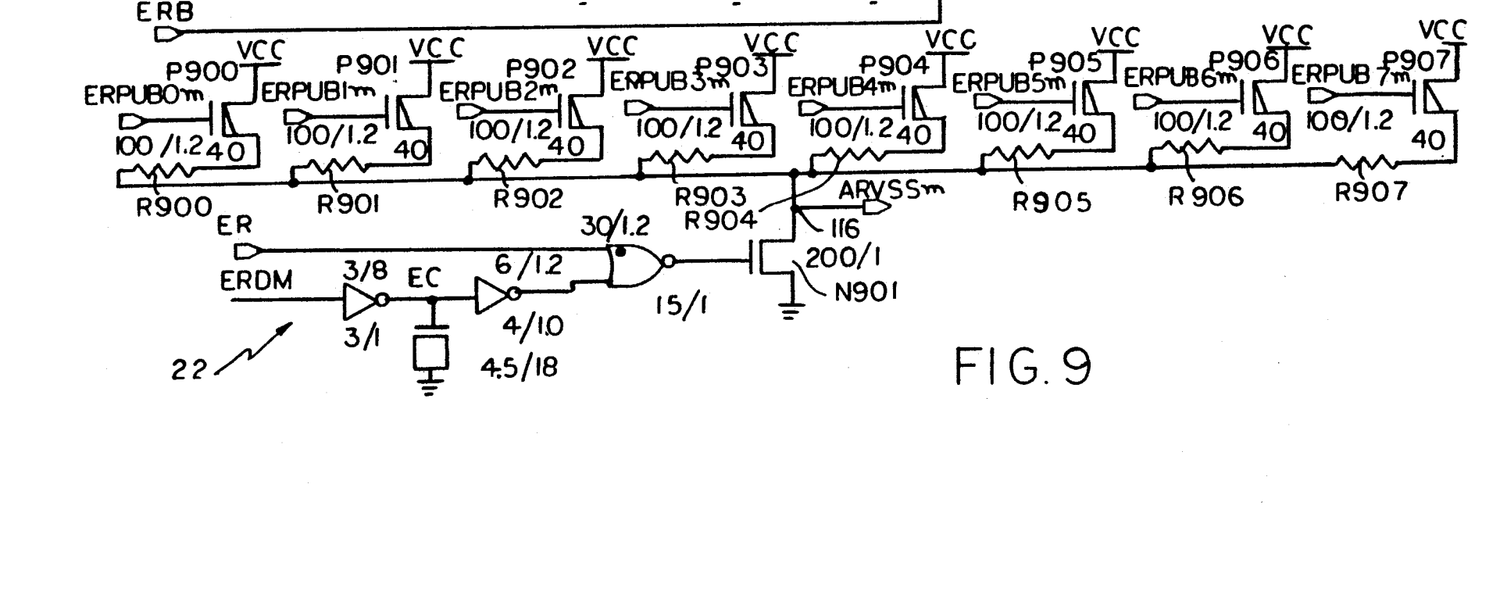
FIG. 9 is a circuit diagram of an array VSS circuit of FIG. 1.

Referring now to FIG. 9, there is shown a circuit diagram of the array VSS circuit 22 of FIG. 1. The array circuit 22 has a plurality of P-channel erase pull-up transistors P900–P907. The sources of the transistors P900–P907 are connected to the power supply potential VCC. The gates of these transistors are connected to receive a respective one of the decoding signals ERPUBϕm–ERPUB7m, which are low for the selected sectors during the erase mode. The drain of these transistors are coupled to a common node 116 via a respective one of the load resistors R900–R907. The node 116 provides the signal ARVSSm which is pulled to the power supply potential VCC so that the sources of the cells in the array have +5.0 volts applied during erase. During non-erase modes, the signal ARVSSm is grounded. A pull-up transistor N901 is used to pull the node 116 to ground. However, it will be noted that the signal applied to the gate of the transistor N901 is delayed by the signal ERDm so as to maintain the same to be off until after the pull-up transistors P900–P907 have been turned off.

Figure 10:
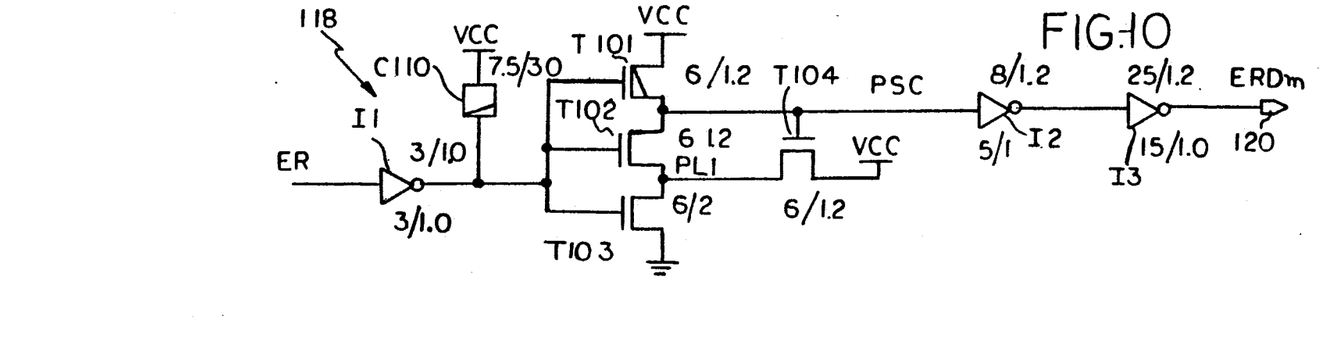
FIG. 10 is a circuit diagram of an erase delay circuit for generating the delayed erase signal ERDm.

In FIG. 10, there is illustrated a circuit diagram of a delayed erase circuit 118 which is a part of the array circuit 22 and is used to generate the delayed erase control signal ERDm on node 120 in response to a delay erase signal ER. The delay circuit 118 includes inverters I1, I2, I3; capacitor C110; and transistors T101, T102, T103, and T1104. On the falling edge of the erase control signal ER at the input of the inverter I1, the output thereof must charge up the capacitor C110 and is then sent through the transistors and the inverters to the node 120.

The clock waveforms PHI1, PHI2, PHI1A, and PHI2A of FIGS. 2(d)–2(g) are generated in the circuitry schematically and illustratively shown in FIGS. 11(a)–11(e) which are circuit diagrams of the negative clock circuit 14 of FIG. 1 These clock waveforms PHI1, PHI2, PHI1A and PHI2A are coupled respectively to the output nodes 76, 80, 82 and 78 (FIG. 4(a). In particular, the signal EROSCB of FIG. 2(c) is generated in FIG. 11(a) in response to input signal OSC (FIG. 2(b)) and ERSEL (FIG. 2(a)). The circuit of FIG. 11(a) includes inverter gates G1, G2 and a NOR logic gate G3. The clock signal PHI1 is generated in FIG. 11(b) in response to the input signals PHI2 (FIG. 2(e)), EROSCB (FIG. 2(c)) and PHI2A (FIG. 2(g)). The circuit of FIG. 11(b) includes an AND logic gate G4, a signal PHI1A is generated in FIG. 11(c) in response to the input signal EROSCB and PHI2 (FIG. 2(e)). The circuit of FIG. 11(e) includes NAND logic gates G9 and inverters G10, G11 and G12.

Figure 11A:
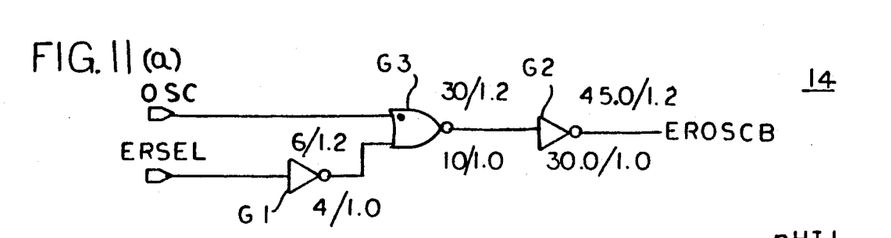
FIGS. 11(a)-11(e) are circuit diagrams of a negative clock circuit for generating the four-phase clock signals for use in FIG. 4(a).
Figures 11B, 11C, 11D:
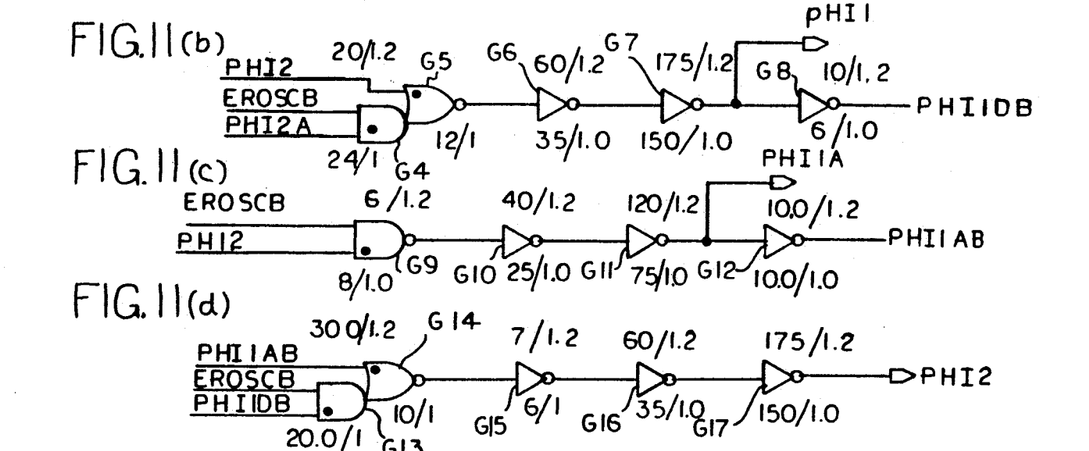
Figure 11E:
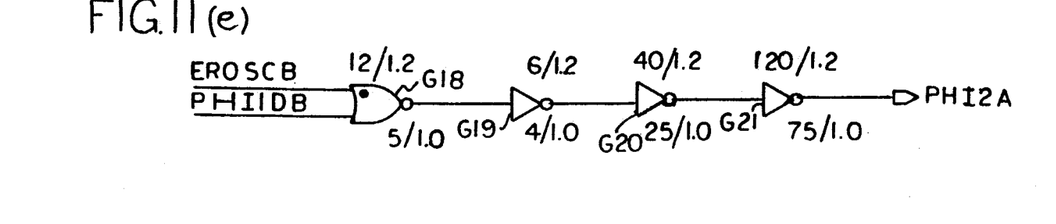

In FIG. 11(d), the clock signal PHI2 is generated in response to the input signal PHI1AB, EROSB, and PHI1DB. The circuit of FIG. 11(d) includes an AND logic gate G13, a NOR logic gate G14, and inverter gates G15–G17. In FIG. 11(e), the clock signal PHI2A is generated in response to the signal EROSCB and PHI1DB. The circuit of FIG. 11(e) includes a NOR logic gate G18, and inverters G19–G21.

From the foregoing detailed description, it can thus be seen that the present invention provides an improved negative power supply for generating and supplying a regulated negative potential to control gates of selected memory cells via wordlines in an array of flash EEPROM memory cells during flash erasure. The negative power supply includes charge pumping means formed of a plurality of charge pump stages for generating a high negative voltage and cancellation means coupled to the charge pumping means for effectively canceling out threshold voltage drops in the charge pump means. Further, a regulator circuit is provided for generating the regulated negative potential to be independent of the power supply potential VCC in response to the high negative voltage and a reference potential.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A negative power supply for generating and supplying a regulated negative potential to control gates of selected memory cells via wordlines in an array of flash EEPROM memory cells during flash erasure, said negative power supply comprising:
   clock means (14) for generating a plurality of clock signals;
   charge pumping means (12) responsive to an external power supply potential (VCC) and to said clock signals for generating a high negative voltage;
   said charge pumping means being formed of a plurality of charge pump stages (401-404);
   cancellation means coupled to each stage of said charge pumping means for effectively canceling out voltage drops due to threshold voltages in said charge pumping means;
   negative well means (20) coupled to said plurality of charge pumping stages for preventing initially the operation of a certain number of said plurality of charge pump stages during erasure; and
   regulation means (16) responsive to said high negative voltage and a reference potential for generating a negative comparator signal which is either at a high level so as to allow said charge pumping means to increase said high negative voltage or is at a low level so as to decrease said high negative voltage and for generating said regulated negative potential to be independent of the supply potential (VCC).

2. A negative power supply as claimed in claim 1, wherein each of said plurality of charge pump stages is comprised of a P-channel pass transistor and a first coupling capacitor, said pass transistor having its source connected to an input node, its drain connected to an output node and its gate connected to an internal node, said coupling capacitor having its one side connected to the output node and its other side connected to receive a first one of said plurality of clock signals.

3. A negative power supply as claimed in claim 2, wherein each of said cancellation means is comprised of a P-channel initialization transistor, a P-channel pre-charge transistor, and a second coupling capacitor, said initialization transistor having its drain and gate connected to the input node and its source connected to the output node, said pre-charge transistor having its source connected to the input node, its gate connected to the output node, and its drain connected to the internal node, said second coupling capacitor having its one side also connected to the internal node and its other side connected to receive a second one of said plurality of clock signals.

4. A negative power supply as claimed in claim 1, wherein said high negative voltage is approximately −12 volts.

5. A negative power supply as claimed in claim 1, wherein said regulated negative potential is approximately −10 volts.

6. A negative power supply as claimed in claim 1, wherein said negative well means generates a negative well signal which is maintained at the power supply potential (VCC) for a short time at the beginning of the erasure and is then allowed to go to 0 volts.

7. A negative power supply as claimed in claim 1, wherein said regulator means is comprised of a differential comparator having a non-inverting input, an inverting input, and an output and a P-channel pull-up transistor, said differential comparator having its noninverting input coupled to said high negative voltage, its inverting input coupled to the reference potential, and its output coupled to the gate of said P-channel pull-up transistor, the source of said P-channel pull-up transistor having its source connected to the power supply potential (VCC), the drain of said P-channel pull-up transistor being coupled to said charge pumping means to provide said regulated negative potential.

8. A negative power supply as claimed in claim 1, further comprising means coupled to said negative well means for generating a protection signal to provide protection of the oxide of a pull-up device in said negative well means.

9. A negative power supply as claimed in claim 1, further comprising array circuit means for generating an array signal which is at a relatively low positive voltage during flash erasure and is supplied to source regions of the selected memory cells.

10. In an array of flash EEPROM memory cells formed on the substrate to define columns and rows, where the substrate includes a common source line extending along at least one of the rows, a plurality of bit lines extending along respective columns, where each memory cell includes an N-type source region coupled to the common source line, a control gate, a floating gate, a channel region and an N-type drain region coupled to a respective one of the bit lines, where each memory cell is erasable predominately by tunneling electrons from its floating gate to its source region, and a negative power supply for generating and supplying a regulated negative potential to control gates of selected memory cells via the wordlines during flash erasure, said negative potential supply comprising:
   clock means (14) for generating a plurality of clock signals;
   charge pumping means (12) responsive to an external power supply potential (VCC) and to said clock signals for generating a high negative voltage;
   said charge pumping means being formed of a plurality of charge pump stages (401-402);
   cancellation means coupled to each stage of said charge pumping means for effectively canceling out voltage drops due to threshold voltages in said charge pumping means;

negative well means (20) coupled to said plurality of charge pumping stages for preventing initially the operation of a certain number of said plurality of charge pump stages during erasure; and regulation means (16) responsive to said high negative voltage and a reference potential for generating a negative comparator signal which is either at a high level so as to allow said charge pumping means to increase said high negative voltage or is at a low level so as to decrease said high negative voltage and for generating said regulated negative potential to be independent of the supply potential (VCC).

11. In an array of flash EEPROM memory cells as claimed in claim 10, wherein each of said plurality of charge pump stages is comprised of a P-channel pass transistor and a first coupling capacitor, said pass transistor having its source connected to an input node, its drain connected to an output node and its gate connected to an internal node, said coupling capacitor having its one side connected to the output node and its other side connected to receive a first one of said plurality of clock signals.

12. In an array of flash EEPROM memory cells as claimed in claim 11, wherein each of said cancellation means is comprised of a P-channel initialization transistor, a P-channel pre-charge transistor, and a second coupling capacitor, said initialization transistor having its drain and gate connected to the input node and its source connected to the output node, said pre-charge transistor having its source connected to the input node, its gate connected to the output node, and its drain connected to the internal node, said second coupling capacitor having its one side also connected to the internal node and its other side connected to receive a second one of said plurality of clock signals.

13. In an array of flash EEPROM memory cells as claimed in claim 10, wherein said high negative voltage is approximately −12 volts.

14. In an array of flash EEPROM memory cells as claimed in claim 10, wherein said regulated negative potential is approximately −10 volts.

15. In an array of flash EEPROM memory cells as claimed in claim 10, wherein said negative well means generates a negative well signal which is maintained at the power supply potential (VCC) for a short time at the beginning of the erasure and is then allowed to go to 0 volts.

16. In an array of flash EEPROM memory cells as claimed in claim 10, wherein said regulator means is comprised of a differential comparator having a non-inverting input, an inverting input, and an output and a P-channel pull-up transistor, said differential comparator having its non-inverting input coupled to said high negative voltage, its inverting input coupled to the reference potential, and its output coupled to the gate of said P-channel pull-up transistor, the source of said P-channel pull-up transistor having its source connected to the power supply potential (VCC), the drain of said P-channel pull-up transistor being coupled to said charge pumping means to provide said regulated negative potential.

17. In an array of flash EEPROM memory cells as claimed in claim 10, further comprising means coupled to said negative well means for generating a protection signal to provide protection of the oxide of a pull-up device in said negative well means.

18. In an array of flash EEPROM memory cells as claimed in claim 10, further comprising array circuit means for generating an array signal which is at a relatively low positive voltage during flash erasure and is supplied to source regions of the selected memory cells.

19. A negative power supply for generating and supplying a regulating negative potential to control gates of selected memory cells via wordlines in an array of flash EEPROM memory cells during flash erasure, said negative power supply comprising:

charge pumping means (12) responsive to an external power supply potential (VCC) and to clock signals for generating a high negative voltage;

said cancellation means coupled to said charge pumping means for effectively canceling out voltage drops due to threshold voltages in said charge pumping means; and regulation means (16) responsive to said high negative voltage and a reference potential for generating a negative comparator signal which is either at a high level so as to allow said charge pumping means to increase said high negative voltage or is at a low level so as to decrease said high negative voltage and for generating said regulated negative potential to be independent of the supply potential (VCC).

* * * * *

UNITED STATES PATENT AND TRADEMARK OFFICE
CERTIFICATE OF CORRECTION

PATENT NO. : 5,282,170
DATED : January 25, 1994
INVENTOR(S) : Van Buskirk et al.

Page 1 of 2

It is certified that error appears in the above-identified patent and that said Letters Patent is hereby corrected as shown below:

Column 1, line 62, "$V_\phi$'s", should be --$V_{tp}$'s--.

Column 2, line 61, "$V_\phi$", should be --$V_{tp}$--.

Column 4, line 7, "offchip", should be -- off-chip --;

line 29, "$V_\phi$", should be --$V_{tp}$--.

Column 5, line 57, "ERPUB$\phi$", should be --ERPUB$\emptyset$--;

line 63, "ERPUB$\phi$m", should be --ERPUB$\emptyset$m--.

Column 6, line 14, "t$\phi$", should be --t$\emptyset$--.

Column 7, line 52, after "than", delete the ",".

Column 8, line 45, "$V_\phi$", should be --$V_{gs}$--.

Column 9, line 14, "$V_\phi$", should be --$V_{tp}$--;

line 17, "11", should be --P11--;

line 21, "$V_\phi$", should be --$V_{tp}$--;

line 33, "$V_\phi$", should be --$V_{tp}$--;

line 36, "$V_\phi$", should be --$V_{tp}$--.

UNITED STATES PATENT AND TRADEMARK OFFICE
CERTIFICATE OF CORRECTION

PATENT NO. :    5,282,170

DATED      :    January 25, 1994

INVENTOR(S) :   Van Buskirk et al.

It is certified that error appears in the above-identified patent and that said Letters Patent is hereby corrected as shown below:

Column 12, lines 9 and 10, "ERPUBØm", should be --ERPUBØm--;

line 50, after "a", insert --NOR logic gate G5,            and inverter gates G6-G8. The clock--

Column 14, line 23, "noninverting", should be

-- non-inverting --.

Signed and Sealed this

Fourteenth Day of June, 1994

Attest:

BRUCE LEHMAN

*Attesting Officer*         *Commissioner of Patents and Trademarks*